(12) United States Patent
Stauder et al.

(10) Patent No.: US 12,231,122 B2
(45) Date of Patent: Feb. 18, 2025

(54) DEVICE AND METHOD FOR APPLYING A LOOK-UP TABLE

(71) Applicant: InterDigital CE Patent Holdings, SAS, Paris (FR)

(72) Inventors: Jurgen Stauder, Montreuil/Ille (FR); Angelo Mazzante, Melesse (FR); Marie-Jean Colaitis, Cesson-sévigné (FR); Patrick Morvan, Laille (FR)

(73) Assignee: InterDigital CE Patent Holdings, SAS, Paris (FR)

( * ) Notice: Subject to any disclaimer, the term of this patent is extended or adjusted under 35 U.S.C. 154(b) by 197 days.

(21) Appl. No.: 18/025,078

(22) PCT Filed: Sep. 6, 2021

(86) PCT No.: PCT/EP2021/074435
§ 371 (c)(1),
(2) Date: Mar. 7, 2023

(87) PCT Pub. No.: WO2022/053417
PCT Pub. Date: Mar. 17, 2022

(65) Prior Publication Data
US 2023/0336178 A1    Oct. 19, 2023

(30) Foreign Application Priority Data
Sep. 8, 2020 (EP) ..................... 20305994

(51) Int. Cl.
*H03K 19/17728* (2020.01)
(52) U.S. Cl.
CPC .............. *H03K 19/17728* (2013.01)
(58) Field of Classification Search
None
See application file for complete search history.

(56) References Cited

U.S. PATENT DOCUMENTS

| 8,194,288 B2 | 6/2012 | Wen et al. |
| 2009/0002782 A1 | 1/2009 | Kulkarni et al. |

(Continued)

FOREIGN PATENT DOCUMENTS

| EP | 0706287 A2 | 4/1996 |

OTHER PUBLICATIONS

Vandenberg et al., "A Survey on 3D-LUT Performance in 10-bit and 12-bit HDR BT.2100 PQ", Society of Motion Picture & Television Engineers (SMPTE), Smpte 2018 Annual Technical Conference & Exhibition, Los Angeles, CA, USA, Oct. 22, 2018, 18 pages.

(Continued)

*Primary Examiner* — Jany Richardson
(74) *Attorney, Agent, or Firm* — Condo Roccia Koptiw LLP

(57) ABSTRACT

A device applies a pre-function w=P(x) to an input signal x to obtain a first result w and applies a LUT to the first result w, wherein the LUT represents a main function $f_w(w)$ defined for a second grid of values Gw such that the pre-function P(x) is piecewise defined on a first grid Gx of signal values, where Gw=P(Gx). The device can further obtain the pre-function P(x), piecewise defined on the first grid Gx of the signal x and calculate the LUT with the second grid Gw=P(Gx). The piecewise pre-function P(x) can be obtained from a second pre-function Q(x) by applying Q(x) to signal values x to calculate the second grid Gw=Q(Gx) and defining the pre-function P(x) piecewise on the first grid Gx by linear interpolation of the values of the second grid Gw such that P(Gx)=Q(Gx).

15 Claims, 6 Drawing Sheets

(56) References Cited

U.S. PATENT DOCUMENTS

| | | | |
|---|---|---|---|
| 2014/0316752 A1* | 10/2014 | Azadet | G06F 17/15 |
| | | | 703/2 |
| 2017/0070735 A1 | 3/2017 | Ramasubramonian et al. | |
| 2018/0332296 A1* | 11/2018 | Kadu | H04N 19/44 |
| 2020/0007718 A1* | 1/2020 | Lee | G06T 3/4007 |
| 2022/0416823 A1* | 12/2022 | Azadet | H04B 1/0475 |
| 2024/0213986 A1* | 6/2024 | Stauder | H03K 19/17728 |

OTHER PUBLICATIONS

Chang et al., "Sequential Linear Interpolation of Multidimensional Functions", Institute of Electronics and Electrical Engineers (IEEE), IEEE Transactions on Image Processing, vol. 6, Issue No. 9, Sep. 1997, 15 pages.

Topiwala et al., "FV10: An efficient single-layer approach to HDR coding, with backward compatibility options", International Society for Optics and Photonics (SPIE), Proceedings of SPIE, vol. 9971, Applications of Digital Image Processing XXXIX, 997109, Sep. 27, 2016, 8 pages.

\* cited by examiner

DEVICE AND METHOD FOR APPLYING A LOOK-UP TABLE

CROSS REFERENCE TO RELATED APPLICATIONS

This application is a U.S. National Stage Application under 35 U.S.C. § 371 of International Patent Application No. PCT/EP2021/074435, filed Sep. 6, 2021, which is incorporated herein by reference.

This application claims priority to European Patent Application No. 20305994.4, filed Sep. 8, 2020, which is incorporated herein by reference in its entirety.

TECHNICAL FIELD

The present disclosure relates generally to signal processing and in particular to signal processing using lookup tables (LUTs).

BACKGROUND

This section is intended to introduce the reader to various aspects of art, which may be related to various aspects of the present disclosure that are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

It is well known to apply a lookup table (LUT) calculated from a second main function f(x) to an input signal x instead of applying the second main function itself, for example to speed up processing. The LUT is typically generated by regular sampling of the second main function.

As an illustrative example, the second main function is an exponential function $f(x)=(10^x-1)/9$ for a one-dimensional signal x in the range [0;1]. In the example, it is assumed that the LUT is a one-dimensional, regular LUT of size 3 having a LUT input grid $\{0; 0.5; 1\}$. The LUT entries are $\{f(0); f(0.5); f(1)\}=\{0; (10^{0.5}-1)/9; 1\}=\{0; 0.24; 1\}$.

The skilled person will appreciate that these principles apply to other signals, such as audio and video signals, for example two-dimensional chromaticity signals, three-dimensional color coordinates or n-dimensional signals in an n-dimensional signal space. These principles also apply to non-regular LUTs, for example having a LUT entry grid $\{0; 0.4; 1\}$ with non-regular intervals of 0.4 and 0.6, respectively.

Since LUTs typically have limited size, in which case their application to signals usually requires interpolation. Vandenberg and Andriani review some interpolation methods in their paper entitled "A Survey on 3D-LUT Performance in 10-bit and 12-bit HDR BT.2100 PQ" presented at SMPTE in 2018.

Generally speaking, to perform interpolation, in a first step, the input signal is interpolated from the LUT input grid. Often linear interpolation is applied, but the same principles apply to non-linear interpolation. In the above example, if the input signal is x=0.2, linear interpolation could use the first two grid values leading to the following interpolation: $x=0.2=c_1 0+c_2 0.5$ where 0 and 0.5 are the first two values of the LUT input grid, respectively, and $c_1=0.6$; $c_2=0.4$ are linear interpolation coefficients. In a second step, the output signal LUT(x) is interpolated from the LUT entries. Usually the same interpolation method as in the first step is used. In the example, linear interpolation is used in the first step. Assuming that linear interpolation is used also for the second step and that, as is usual, the same interpolation coefficients are used, this gives the output signal LUT(x) $=c_1 0+c_2 0.24$. However, other coefficients and other interpolation methods can be used to derive LUT(x) from the LUT entries.

If the second main function is non-linear and the interpolation of the LUT entries is linear, the effect of applying the LUT is like a piecewise interpolation of the second main function. If a second main function f(x) is sampled and saved in a LUT, the application of the LUT to a signal x using linear interpolation can be written as a LUT application function $LUT(x)=PL_x(f(x))$ where $PL_x(\ )$ is piecewise linearization on a grid of signal values x. For example, if the LUT is three-dimensional, well-known piecewise interpolation methods include trilinear, prism and tetrahedral interpolation.

It is also well-known to apply a pre-function to a signal before applying a LUT. A pre-function is usually a monotonously increasing function. The pre-function may itself being applied using a look-up-table, in the following called pre-LUT. The pre-function is typically one-dimensional. If the LUT is multi-dimensional, a one-dimensional pre-function can be applied to each of the signal coordinates, i.e. to each dimension. However, a pre-LUT can also be multi-dimensional. For example, a three-dimensional LUT designed for a three-dimensional input signal could be preceded by a two-dimensional pre-LUT for two channels and a one-dimensional pre-LUT for the third channel. Also, not all channels may be processed using a pre-LUT or a pre-function. For example, a two-dimensional LUT designed for a two-dimensional input signal may pe preceded by a one-dimensional pre-function for the first channel, only, while the second channel is directly input to the LUT. In order to simplify the description, in the following, the case of a one-dimensional LUT and a one-dimensional pre-function is considered, but it will be appreciated that the principles can be extended to higher dimensions. When applying a pre-function Q(x) to a signal, the signal range of Q(x) is often equal to the signal range of the signal x itself. For example, in case of a one dimensional pre-function, if input values are within the range [0;1], the application of the pre-function will yield values that are also within the range [0;1]. However, prefunctions can also include a change of range. For example, a one-dimensional input signal in the range [0;220] can have a range of [0;1] after application of the pre-function. In the following, for simplicity, it is assumed that pre-functions preserve the signal range. However, all principles also apply to pre-functions that do not preserve the signal range.

A common reason for applying a pre-function is to reduce LUT interpolation errors. As soon as the sampling of the second main function on the LUT input grid resulting in the LUT entries does not fully represent the second main function in the sense of sampling theory, any interpolation applied to the LUT entries will usually generate LUT interpolation errors. For example, if linear interpolation is used to apply the LUT to the input signal and if the second main function is non-linear, interpolation errors will cause that the resulting LUT application function LUT(x) is not equal to the second main function itself. In order to reduce LUT interpolation errors, the pre-function can be designed using multiple criteria.

A first criterion for designing a pre-function Q(x) is non-linearity of the second main function itself. In this case, the pre-function Q(x) preferentially has a slope Q'(x)>1 for a range of input values x where the second main function f(x) is steep, i.e. where |f'(x)|>1.

Another criterion for designing the pre-function is to increase the precision of the output signal—in other words to reduce LUT interpolation errors—for a certain range of input values x than for other ranges. This can be achieved by a pre-function Q(x) having a slope Q'(x)>1 for this range of input values.

Examples of well-known pre-functions are logarithmic, exponential and sigmoid functions, but other functions may also be used.

The application of a pre-function Q(x) to a signal x will result in a signal w=Q(x). After application of the pre-function, generally the LUT is applied to the signal w resulting in LUT(w). The process of applying a pre-function and a LUT to a signal x can be denoted as LUT(Q(x)). Usually this solution replaces the direct application of a given second main function f(x) to the signal, which means that it is preferred that LUT(Q(x)) is as close to f(x) as possible. If a pre-function is applied before the LUT, the pre-function has to be considered within the LUT in order to satisfy this preference. The consideration of the pre-function within the LUT can be achieved using several known methods, one of which will now be described.

An example method of considering the pre-function within the LUT and making LUT(Q(x)) close to f(x) is to inverse the pre-function Q(x) within the LUT, which gives a new, adapted lookup table $LUT_Q$ such that $LUT_Q(w)=PL_w$ $(f(Q^{-1}(w))$ where $PL_w$ is piecewise linearization based on a regular sampling of w. With w=Q(x) follows that $LUT_Q(Q(x))=PL_w(f(x))$ and therefore close to f(x) up to piecewise linearization. The function $f(Q^{-1}(w))$ is called "concateneated function" or "adapted function". It can be said that the adapted lookup table $LUT_Q$ can be derived from the adapted function $f_w(w)=f(Q^{-1}(w))$ by sampling in w in the same way as a common lookup table LUT is derived from a common second main function f(x) by sampling in x. The advantage of using the pre-function is that w=Q(x) is regularly sampled instead of x. The errors of interpolation are regularly distributed over the range of w, but irregularly distributed over the range of x. Depending on the pre-function, errors can be reduced in certain parts of the range of x and increased in other parts. In other words, the pre-function changes the regularly sampled lookup table LUT(x) into a combination of pre-function and adapted lookup table denoted as $LUT_Q(Q(x))$ where this combination corresponds to a non-regular sampling of x.

For example, if the pre-function is a logarithmic function $Q(x)=\log_2(x+1)$, the inverse pre-function is $Q^{-1}(w)=2^w-1$. Then, the entries of the adapted look-up-table $LUT_Q$— derived from the above example of a regular LUT—are $\{f(Q^{-1}(0)); f(Q^{-1}(0.5)); f(Q^{-1}(1))\}=\{0; 0.41; 1\}$. When applying the LUT, the input signal values within a first interval between 0 and $Q^{-1}(0.5)=0.41$ are transformed using the first and second LUT entries, while input signal values within a second interval between $Q^{-1}(0.5)=0.41$ and 1 are transformed using the second and third LUT entries. The benefit of the pre-function is that the signal values within the first interval will, in general, have higher precision, since the interval is smaller and the sampling is more dense. Higher precision means a smaller LUT application error $E=f(x)$ $LUT_Q(Q(x))$. This is the error introduced when representing the second main function as a LUT or as concatenation of a pre-LUT and a LUT while applying it to the input signal. More specifically, the LUT application error is the difference between result of application of pre-function and LUT to the signal compared to the result of application of the second main function itself to the signal. The reason why—in general—the LUT application error is smaller for signal values in the first interval is that the first interval is smaller. Hereby, the density of LUT entries per signal range is higher and the signal values are transformed with less LUT application error than the values in the second interval.

However, the use of a pre-function as described above may lead to additional error due to local mismatch between the pre-function and the interpolation method used during LUT application.

Continuing the above example, consider input signal values between 0 and 0.41 transformed using the first and second LUT entries. The pre-function ensures that x=0 and x=0.41 are mapped to w=0 and w=0.5, respectively. However, the pre-function $Q(x)=\log_2(x+1)$ is not linear in [0, 0.41]. After application of the pre-function to the signal x resulting in w=Q(x), the non-linearity of the pre-function is nowhere compensated for since the application of $LUT_Q$ to w is an interpolation of the first and second LUT entries using an interpolation method independent of the pre-function. For example, if the interpolation method is linear, the non-linearity of the pre-function impacts on the resulting output signal.

In other words, a pre-function allows to focus LUT precision to a part of the range of the input signal and may therefore enhance precision for a part of the range of input signal in a large scale, but the non-linearity of the pre-function may affect the precision negatively in a micro-scale, in between two LUT entries, notably when using linear interpolation for LUT application. In this way, certain non-linear pre-functions can increase the non-linearity of $LUT_Q(Q(x))$ and may even increase the error LUT application error E. In particular, interpolation errors may increase when using linear interpolation for the application of the adapted LUT. If more sophisticated interpolation methods, such as non-linear interpolation, are used, interpolation error may be reduced compared to linear interpolation, but non-linear pre-functions can still increase the non-linearity of the process $LUT_Q(Q(x))$ of LUT application and thus increase the LUT application error.

It will thus be appreciated that there is a desire for a solution that addresses at least some of the shortcomings related to LUTs. The present principles provide such a solution.

SUMMARY OF DISCLOSURE

In a first aspect, the present principles are directed to a method comprising applying a pre-function w=P(x) to an input signal x to obtain a first result w and applying a LUT to the first result w, wherein the LUT represents a main function $f_w(w)$ defined for a second grid of values Gw such that the pre-function P(x) is piecewise defined on a first grid Gx of signal values, where Gw=P(Gx).

In a second aspect, the present principles are directed to a device comprising memory configured to store processor-executable program code instructions and at least one hardware processor configured to execute the program code instructions to apply a pre-function w=P(x) to an input signal x to obtain a first result w and apply a LUT to the first result w, wherein the LUT represents a main function $f_w(w)$ defined for a second grid of values Gw such that the pre-function P(x) is piecewise defined on a first grid Gx of signal values, where Gw=P(Gx).

In a third aspect, the present principles are directed to a computer program product which is stored on a non-transitory computer readable medium and includes program code instructions executable by a processor for implementing the steps of a method according to any embodiment of the first aspect.

BRIEF DESCRIPTION OF DRAWINGS

Features of the present principles will now be described, by way of non-limiting example, with reference to the accompanying drawings, in which.

DESCRIPTION OF EMBODIMENTS

Figure 1:
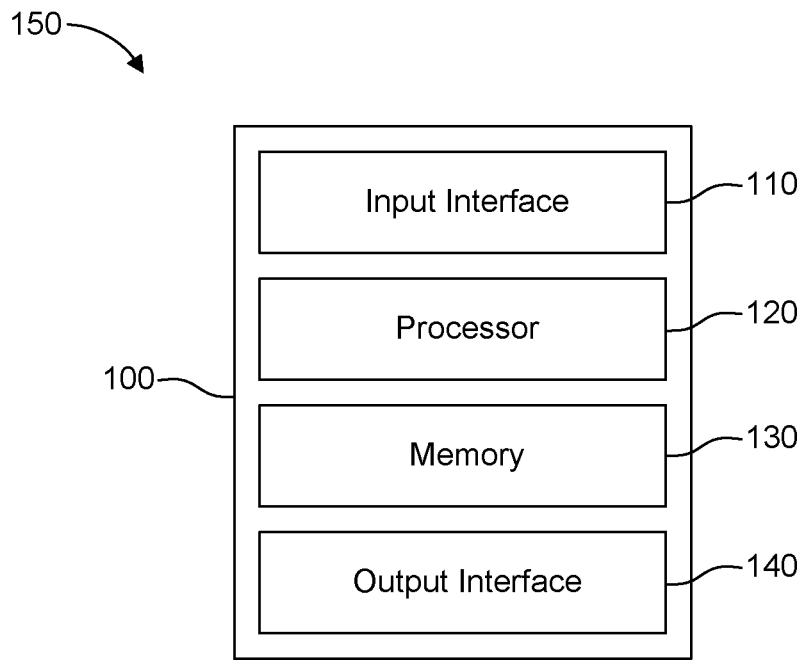
FIG. 1 illustrates a device according to an embodiment of the present principles.

FIG. 1 illustrates a device 100 according to an embodiment of the present principles. The device 100 includes at least one input interface 110 configured to receive a signal, at least one hardware processor 120 ("processor") configured to, among other things, control the device 100, process received signals, and execute program code instructions to perform at least one method of the present principles. The device 100 also includes memory 130 configured to store the program code instructions, execution parameters, at least one lookup table (LUT), and so on, and at least one output interface 140 configured to output processed signals. A non-transitory computer readable medium 150 stores program code instructions that, when executed by a processor (e.g. processor 120), implement the steps of a method according to at least one embodiment of the present principles.

In the embodiments described hereinafter, it is assumed that the input signal x is obtained, for example from an external device (not shown), retrieved from memory or as a result of internal calculations. The result can be output or used, for example in further calculations.

Figure 2:
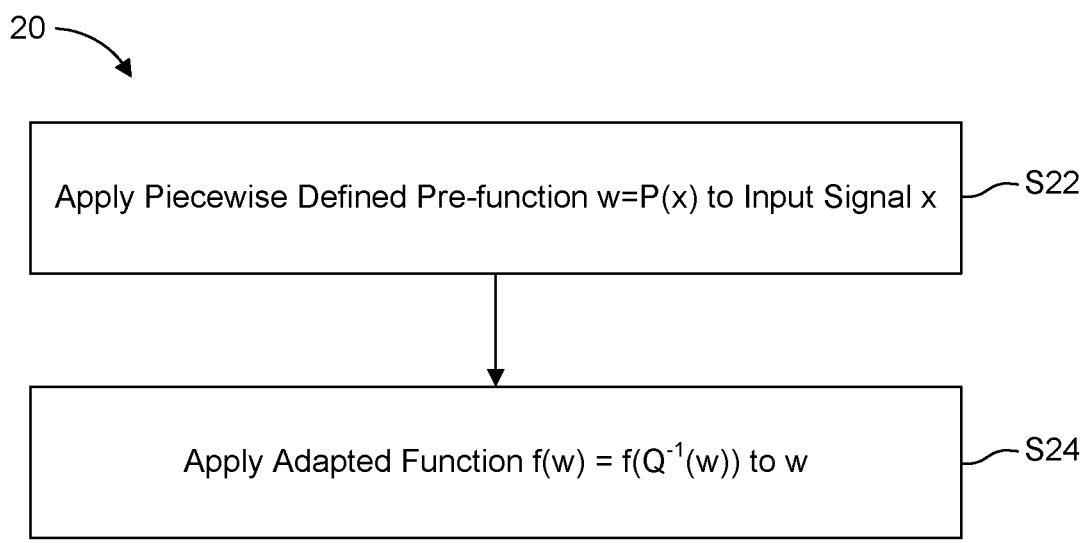
FIG. 2 illustrates a method according to a first embodiment of the present principles.

FIG. 2 illustrates a first embodiment of a method 20 according to the present principles. In the first embodiment, in step S22, the processor 120 first applies a pre-function w=P(x) to an input signal x and then, in step S24, applies a main function $f_w(w)$ to the result of the pre-function, where the main function $f_w(w)$ is represented within a LUT defined for a grid of values Gw in a way that the pre-function is piecewise defined on a grid Gx of signal values where Gw=P(Gx).

The pre-function P(x) is monotonously increasing and thus invertible. Apart from the restriction to be monotonously increasing, it is possible for the pre-function and the LUT to be of any type and character. For example, the piecewise pre-function P(x) may be made up of one or more of logarithmic, sigmoid, exponential, polynomial-type and linear pieces.

If the signal x is n-dimensional, various possibilities arise. The pre-function may be n-dimensional, too. The pre-function may alternatively be one-dimensional and applied to each of the coordinates of x. It is also possible to use a plurality of different pre-functions that can have different dimensionality as long as at least one coordinate of the signal x is processed by a pre-function.

Figure 3:
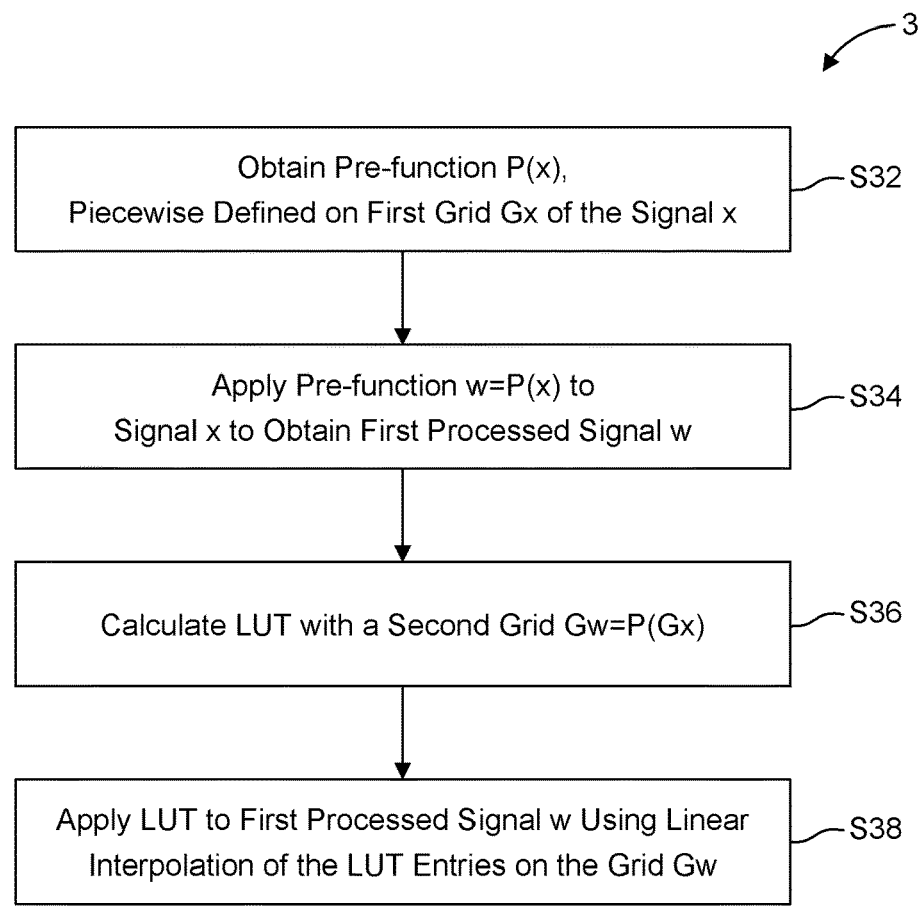
FIG. 3 illustrates a method according to a second embodiment of the present principles.

FIG. 3 illustrates a second embodiment a method 30 of the present principles, in which a pre-function P(x) is defined in a piecewise manner on a grid Gx and used as a pre-function to a LUT, the LUT is applied using interpolation of the LUT entries on the grid Gw=P(Gx).

For example, if the pre-function P(x) is chosen to be piecewise linear in Gx, the inverse function is piecewise linear in Gw. A linear interpolation of the grid Gw=P(Gx) is then used for the application of the LUT to the signal w=P(x). In other words, the LUT output signal is interpolated from the LUT entries using linear interpolation.

In another example, the pre-function P(x) is chosen to be $\log_2(x+1)$ within the range [0,0.41] which is part of Gx. After application of P(x), the signal w=P(x) is obtained. The inverse pre-function is $2^w-1$ is linear on the range [0;0.5] which is part of Gw. The output signal is calculated as a linear interpolation of the LUT entries on the grid values 0 and 0.5 of the grid Gw.

In step S32, the processor 112 obtains a pre-function P(x) that is piecewise defined on a first grid Gx of the signal x. In step S34, the pre-function is applied to the signal x resulting in a first processed signal w=P(x). In step S36, a LUT with a second grid Gw=P(Gx) is calculated. In step S38, the LUT is applied to the first processed signal w, using linear interpolation of the LUT entries on the grid Gw to obtain a second processed signal.

Figure 4:
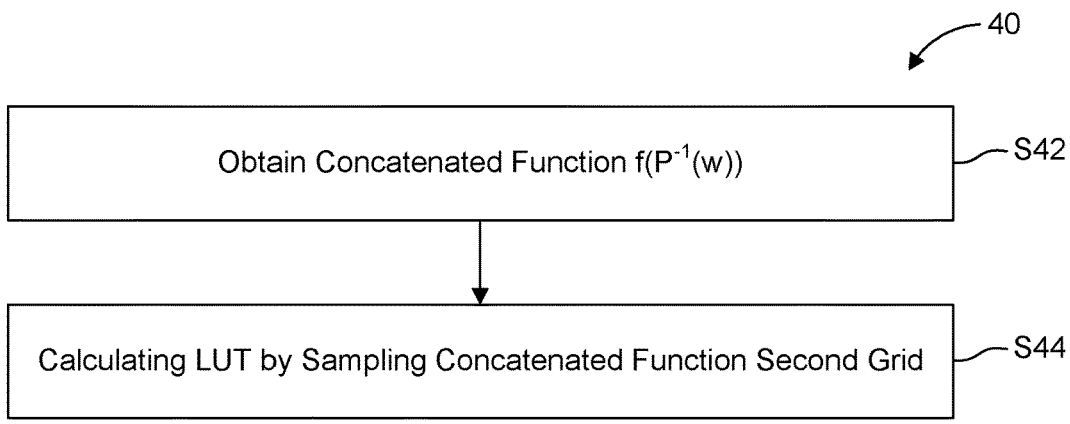
FIG. 4 illustrates a variant of the second embodiment.

In a first variant method 40 of the second embodiment, illustrated in FIG. 4, the LUT is obtained by concatenating, in step S42, the inverse $P^{-1}(w)$ of the pre-function P(x) in order to obtain a concatenated function, called "adapted function" $f_w(w)=f(P^{-1}(w))$ and by calculating, in step S44, the LUT by sampling said concatenated function over the second grid Gw.

As can be seen, the variant builds an adapted LUT from a pre-function P(x) and a second main function f(x), ensuring that application of the pre-function and the LUT to a signal is equal to applying said second main function directly up to the LUT application error. For example, when using a pre-function P( ), the adapted, regular LUT is defined on the regular grid Gw of the signal w=P(x) by sampling the concatened, adapted function $f_w(w)=f(P^{-1}(w))$ on Gw. The grid Gw of the signal w corresponds to a grid Gx of the signal x. If Gx is denoted $G_x=\{x_i, 0\le i<I\}$, Gw can be denoted as $G_w=P(G_x)=\{P(x_i), 0\le i<I\}$. If Gw is regular and P( ) is non-linear, Gx is a non-regular grid.

Figure 5:
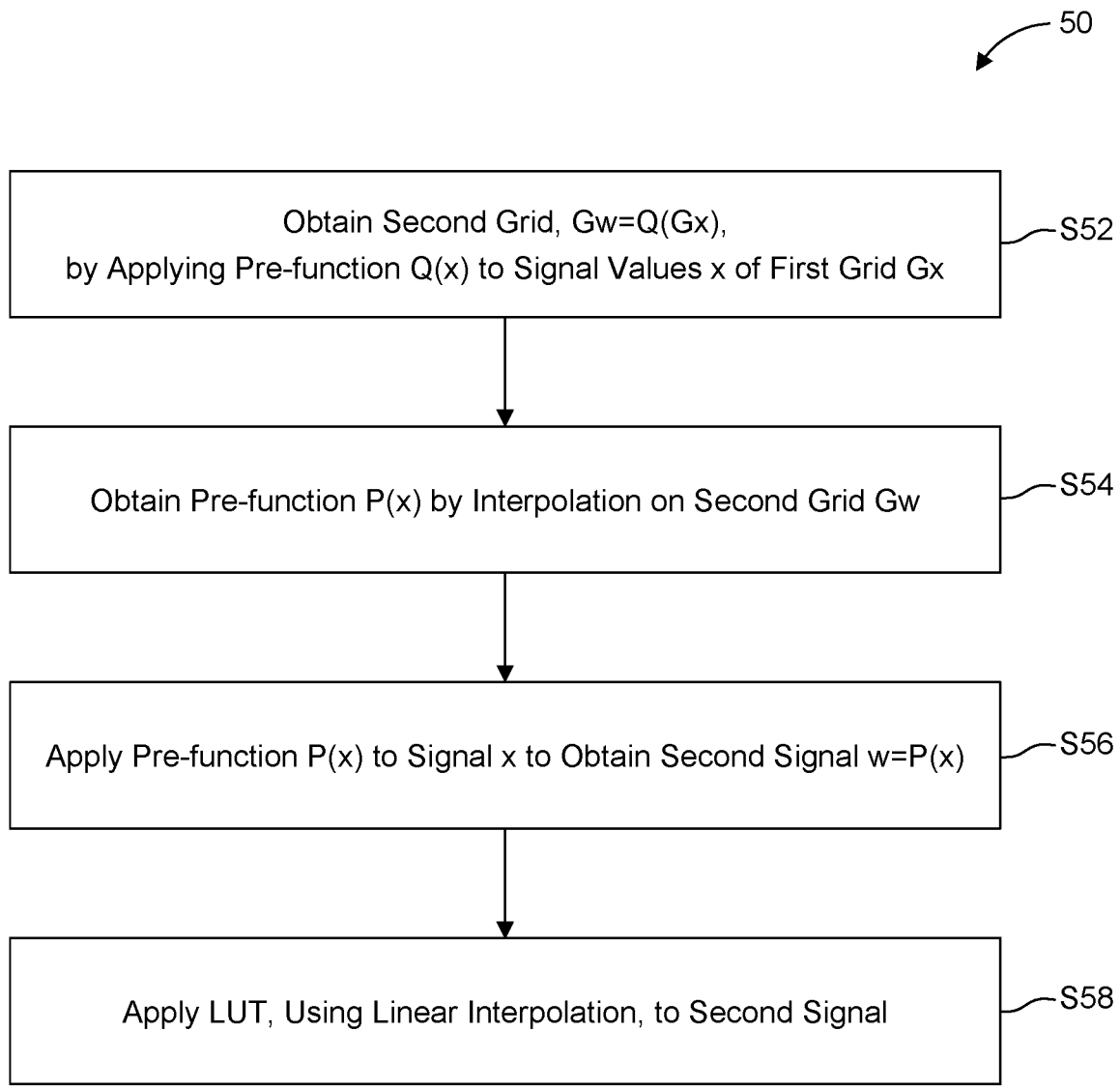
FIG. 5 illustrates a variant of the first and the second embodiments.

In a second variant, which is a variant method 50 of the first and the second embodiment, illustrated in FIG. 5, the piecewise pre-function P(x) can be obtained from a pre-function Q(x) as follows.

In step S52, the pre-function Q(x) is applied to a grid Gx of the signal values x to obtain a second grid Gw=Q(Gx). In step S54, the pre-function P(x), piecewise defined on the grid Gx, is obtained by linear interpolation of the values of the grid Gw. The effect is that Gw=P(Gx)=Q(Gx). In step S56, the pre-function P(x) is applied to the signal x to obtain a second signal w=P(x). In step, S58, the LUT is applied, using linear interpolation, to the second signal.

The second variant can be useful since Q(x) is typically not a piecewise defined function since Q(x) is chosen intentionally. For example, Q(x) may be chosen to influence the precision of the LUT. The piecewise defined function P(x) is then an approximation of Q(x).

Using the second variant, the embodiment can easily be integrated into conventional frameworks that use pre-functions Q(x) that are not piecewise defined. Assuming that the conventional framework includes applying a pre-function $Q(x)$ to a signal x resulting in $w=Q(x)$, calculating an adapted lookup table $LUT_Q$ by sampling the adapted function $f(Q^{-1}(w))$ over a regular grid $Gw=Q(Gx)$, applying the adapted LUT to the signal w using linear interpolation according to $LUT_Q(w)=PL_w(f(Q^{-1}(w)))$ where $PL_w$ is piecewise linearization based on a regular sampling of w.

Using the second variant, the conventional processing is altered to be as follows: applying the pre-function $P(x)$ to a signal x resulting in $w=P(x)$, calculating an adapted lookup-table $LUT_P$ by sampling the adapted function $f(P^{-1}(w))$ over a regular grid $Gw=P(Gx)=Q(Gx)$, applying the adapted $LUT_P$ to the signal w using linear interpolation according to $LUT_P(w)=PL_w(f(P^{-1}(w)))$ where $PL_w$ is a piecewise linearization based on a regular sampling of w.

It is noted that if the employed interpolation is conservative, the grid Gw does not change when replacing a standard pre-function $Q(x)$ by a pre-function $P(x)$ according to the present principles since $Gw=P(Gx)=Q(Gx)$ holds. It follows that the adapted lookup table $LUT_P$ equals the adapted lookup table $LUT_Q$. An advantage of this is that when replacing $Q(x)$ by $P(x)$, the lookup table does not need to be recalculated.

In the following, an example for the second variant is given. A standard pre-function $Q(x)$ used in conventional solutions for a one-dimensional signal x in the range [0;1] is the logarithmic function $Q(x)=\log_2(x+1)$. Using a regular, one-dimensional, adapted LUT of size 3 defined on a regular grid $G_w=\{0; 0.5; 1\}$, the grid for defining a piecewise linear pre-function $P(x)$ will be $G_x=\{f(Q^{-1}(0)); f(Q^{-1}(0.5)); f(Q^{-1}(1))\}=\{0; 0.41; 1\}$. For example, within the interval [0;0.41] the piecewise linear pre-function will be $$P(x) = Q(0) + \frac{Q(0,41) - Q(0)}{0,41}x = \frac{0.5}{0.41}x.$$

In the corresponding interval $0 \le w < 0.5$, linear interpolation will be used when applying the adapted LUT. This linear interpolation corresponds to the inverse of the piece of the pre-function defined on the interval [0;0.41].

Figure 6:
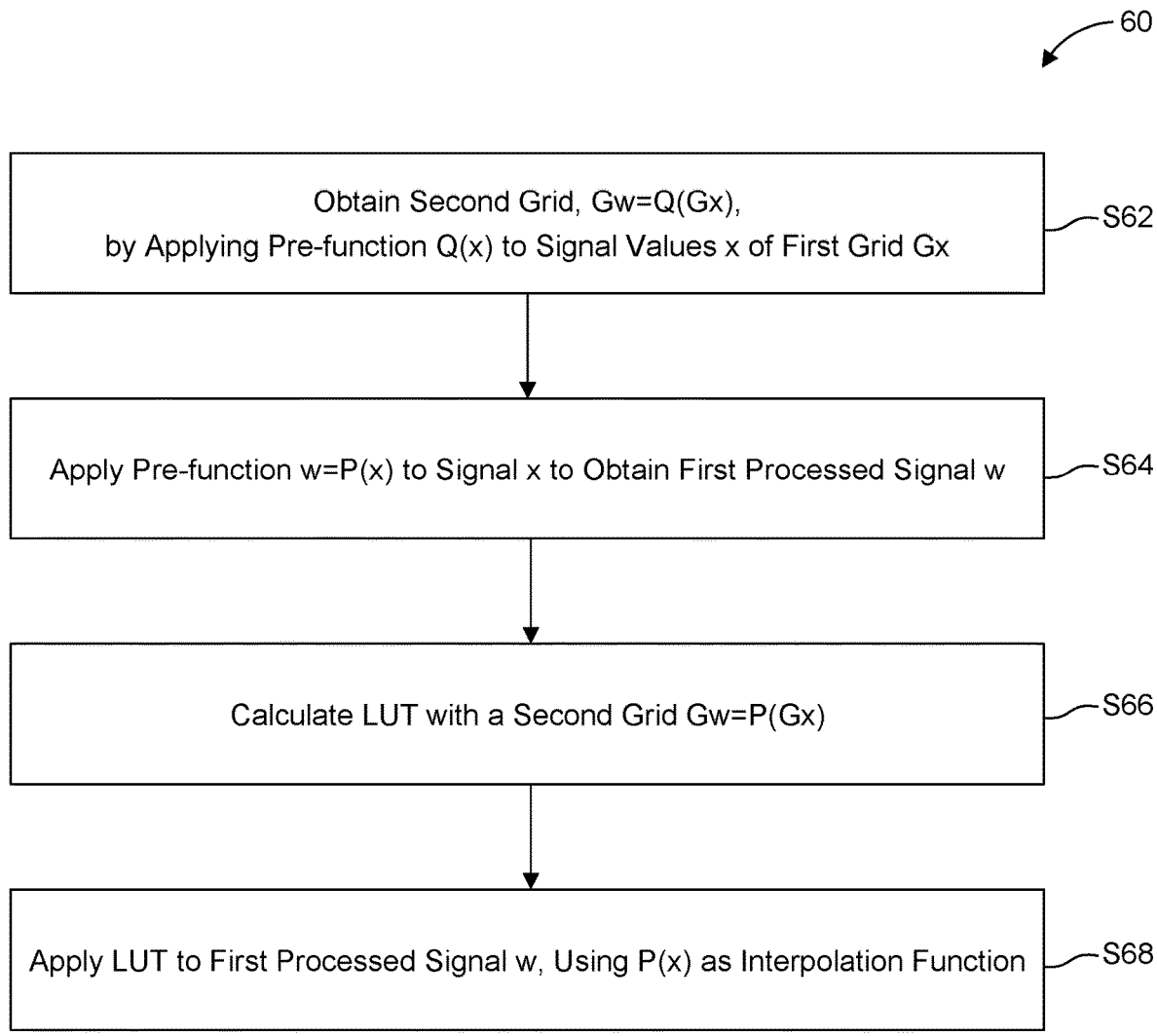
FIG. 6 illustrates a further variant.

FIG. 6 illustrates a third variant of a method 60 according to an embodiment of the present principles. In step S62, a second grid, $Gw=Q(Gx)$, is obtained by applying pre-function $Q(x)$ to signal values x of first grid Gx. In step S64, a pre-function $w=P(x)$ is applied to signal x to obtain first processed signal w. In step S66, a LUT with a second grid $Gw=P(Gx)$ is calculated. In step S68, the LUT is applied to first processed signal w, using $P(x)$ as interpolation function.

Figure 7:
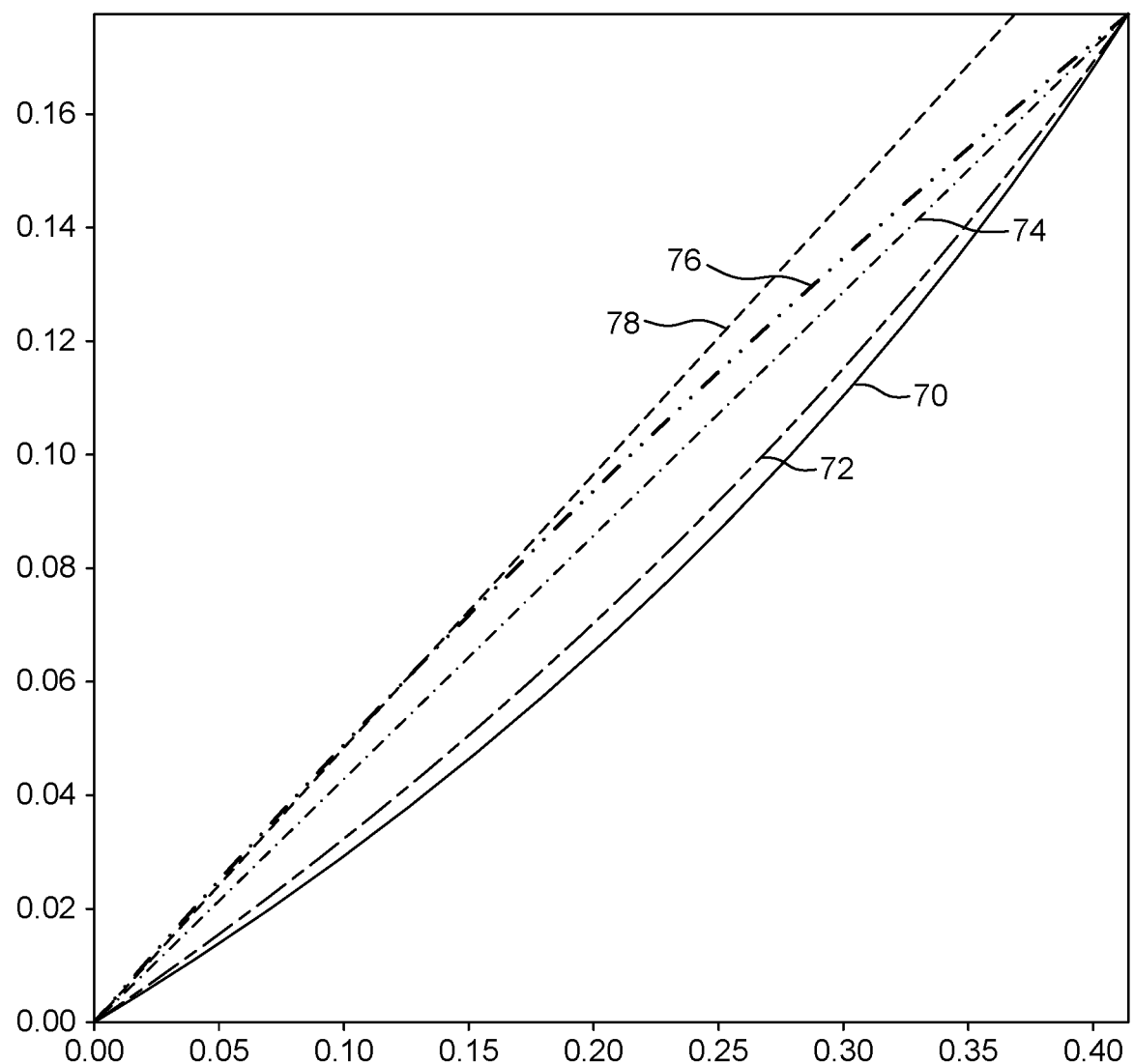
FIG. 7 illustrates example results.

FIG. 7 illustrates example results. It can be seen that the second main function 70 (continuous line) is best approximated using a lookup table with pre-function according to the shape of the second main function based on the present principles 72 (short dash, long dash) compared to LUT application with linearized pre-function according to the present principles 74 (one dot, one dash), known lookup tables with 76 (two dots, one dash) or without 78 pre-function (dashed line).

In a third variant, which is a variant of the first and the second embodiments, the piecewise pre-function is further chosen depending on the second main function.

For at least one piece of the pre-function, the curvature of the second main function is analysed in at least one interval that corresponds to the piece of the pre-function.

The shape of the pre-function for the at least one piece is modified according to the shape of the second main function in at least one interval that corresponds to the at least one piece.

For the interval of values x that correspond to the at least one piece, the LUT application error is calculated. The LUT application error is the difference between the result of application of the second main function to the signal x and the application of the pre-function to the signal x followed by the application of a LUT according to the present principles.

The analysis, the modification of the shape and the calculation of the LUT application error are repeated until the LUT application error has decreased sufficiently, e.g. below a given value or as a ratio of the initial error.

An example of a first way of modifying the shape of the pre-function is to determine a concave curvature for this piece of the pre-function if the second main function in the at least one corresponding interval is convex and vice versa, as will now be shown.

Figure 8:
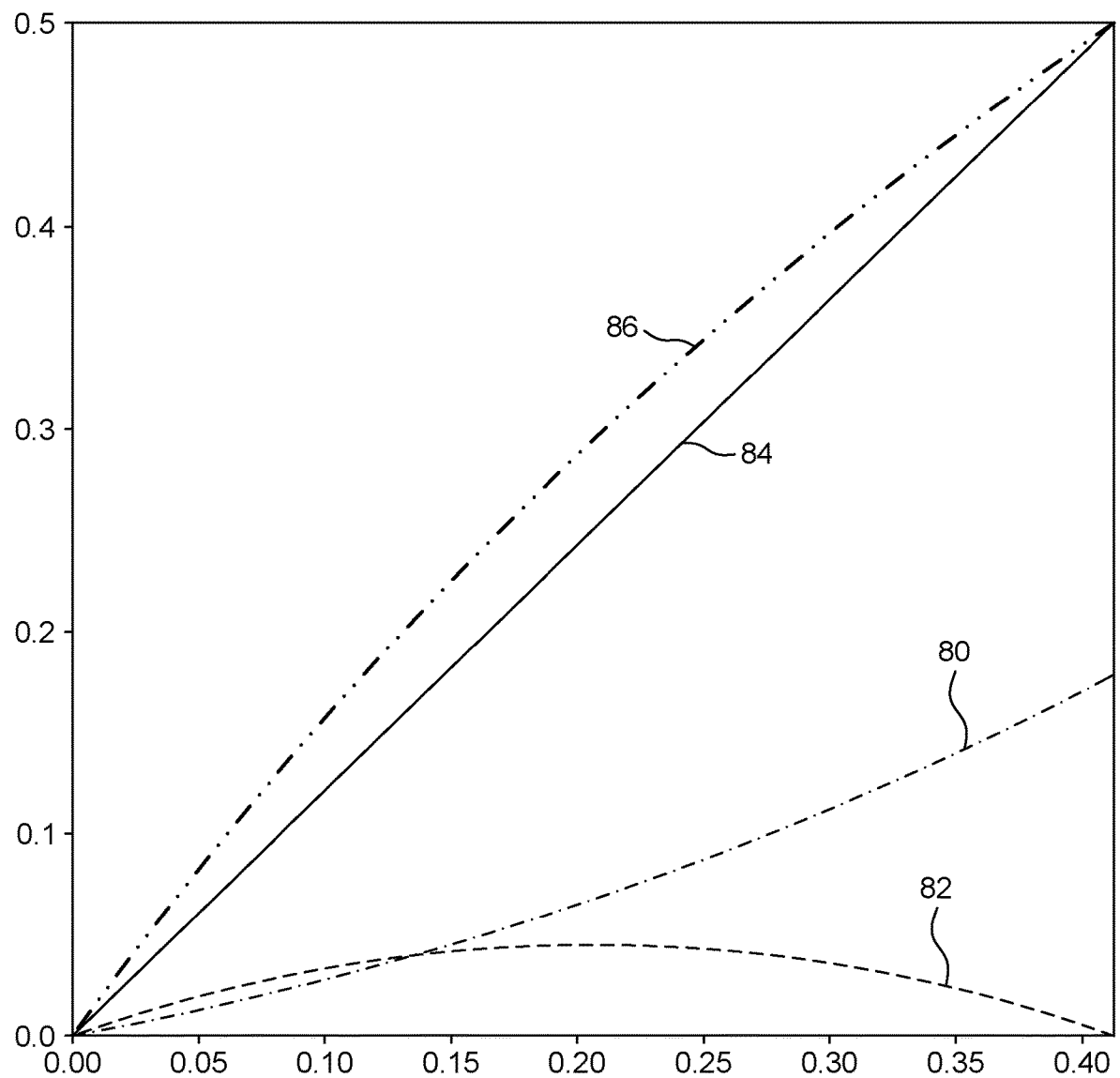
FIG. 8 illustrates examples of functions.

Continuing the above example, using a linearized, logarithmic pre-function and a LUT of size 3, the pre-function can be chosen according to the second main function in the following way. FIG. 8 shows the second main function $f(x)$ that is concave in the interval [0;0.41] of the piecewise defined pre-function. Therefore, a convex term $g(x)$ is added leading to a modified pre-function $R(x)$:

$$R(x) = P(x) + g(x) = \frac{0.5}{0.41}x + g(x)$$

with $$g(x) = a - \left(\frac{2\sqrt{a}}{b}x - \sqrt{a}\right)^2$$

where the parameters a and b allow to further adapt the convex term for the second main function. For example, the convexity in the interval [0;0.41] can be controlled by parameter $$a = \frac{1}{4}(f(0.5) - f(0))$$

and parameter $b=0.5-0=0.5$ allows to place the convexity in the interval [0;0.41] such that $g(0)=0$ and $g(0.41)=0$.

If the input signal is multi-dimensional, concavity or convexity of the second main function can be analyzed channel-wise. For example, if the second main function is analyzed for a specific channel, the corresponding channel of the pre-function, or in case of a one-dimensional pre-function, the pre-function applied to this channel is then modified according to the present principles.

FIG. 8 shows the second main function $f(x)$ 80 (dot, dash) that is concave in the interval [0;0.41], the added convex term $g(x)$ 82 (dashed) that is zero at 0 and at 0.41, the piecewise linear pre-function $P(x)$ according to present principles 84 (continuous line) and the modified pre-function $R(x)$ according to present principles 86 (two dots, one dash) that is convex within the interval [0;0.41].

It is convenient that the added convex term $g(x)$ is zero at the border of the intervals for two reasons. First, the effective irregular sampling of x introduced by the piecewise linear pre-function $Q(x)$ is the same as for the modified pre-function $R(x)$, i.e. the grids Gw and Gx remain unchanged when Q(X) is replaced by R(X). Second, when calculating the adapted LUT, neither R(x) nor g(x) need to be inverted, since for all w on the grid Gw holds $f(Q^{-1}(w))=f(R^{-1}(w))$.

A second way of modifying the shape of the pre-function is to optimize the shape of at least one piece of the pre-function Q(x) with respect to the shape of the second main function in at least one corresponding interval such that the LUT application error is minimized. This approach is trivial for a one-dimensional LUT but makes little or no sense since R(x) may become as non-linear as the second main function is and the complexity gain of replacing the second main function by a LUT is lost by applying a complex pre-function. However, in case of a multi-dimensional LUT, it may make sense to optimize the piecewise defined pre-function or the added concave term such that— in the mean over the multiple dimensions—the LUT application error is minimal. For example, the piecewise linear pre-function is modified using the term g(x) as described above, becoming a non-linear pre-function R(x). Then, the parameters a and b are optimized such that the LUT application error is minimized.

It will thus be appreciated that the present principles can reduce the LUT application error, i.e. the error introduced when representing a second main function as a LUT while applying it to a signal, and that a piecewise linear pre-function can itself be implemented as a LUT.

It should be understood that the elements shown in the figures may be implemented in various forms of hardware, software or combinations thereof. Preferably, these elements are implemented in a combination of hardware and software on one or more appropriately programmed general-purpose devices, which may include a processor, memory and input/output interfaces.

The present description illustrates the principles of the present disclosure. It will thus be appreciated that those skilled in the art will be able to devise various arrangements that, although not explicitly described or shown herein, embody the principles of the disclosure and are included within its scope.

All examples and conditional language recited herein are intended for educational purposes to aid the reader in understanding the principles of the disclosure and the concepts contributed by the inventor to furthering the art, and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that the block diagrams presented herein represent conceptual views of illustrative circuitry embodying the principles of the disclosure. Similarly, it will be appreciated that any flow charts, flow diagrams, and the like represent various processes which may be substantially represented in computer readable media and so executed by a computer or processor, whether or not such computer or processor is explicitly shown.

The functions of the various elements shown in the figures may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, read only memory (ROM) for storing software, random access memory (RAM), and non-volatile storage.

Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

In the claims hereof, any element expressed as a means for performing a specified function is intended to encompass any way of performing that function including, for example, a) a combination of circuit elements that performs that function or b) software in any form, including, therefore, firmware, microcode or the like, combined with appropriate circuitry for executing that software to perform the function. The disclosure as defined by such claims resides in the fact that the functionalities provided by the various recited means are combined and brought together in the manner which the claims call for. It is thus regarded that any means that can provide those functionalities are equivalent to those shown herein.

The invention claimed is:

1. A method, performed in a device and comprising:
   applying a pre-function w=P(x) to an input signal x to obtain a first result w; and
   applying a look up table (LUT) to the first result w, wherein the LUT represents a main function $f_w(w)$ defined for a second grid of values Gw such that the pre-function P(x) is piecewise defined on a first grid Gx of signal values, where Gw=P(Gx), and
   wherein the pre-function P(x) is obtained from a second pre-function Q(x) by applying Q(x) to signal values x to calculate the second grid Gw=Q(Gx) and defining the pre-function P(x) piecewise on the first grid Gx by linear interpolation of the values of the second grid Gw such that P(Gx)=Q(Gx).

2. The method of claim 1, wherein the signal x is n-dimensional and the pre-function P(x) is applied to less than all the n dimensions of the signal x.

3. The method of claim 1, further comprising:
   obtaining the pre-function P(x), piecewise defined on the first grid Gx of the signal x; and
   calculating the LUT with the second grid Gw=P(Gx).

4. The method of claim 1, wherein the LUT is calculated by:
   concatenating an inverse function $P^{-1}(w)$ of the pre-function P(x) and a second main function f(x) to obtain the main function $f_w(w)$ as concatenated function $f_w(w)=f(P^{-1}(w))$; and
   sampling the concatenated function over the second grid Gw.

5. The method of claim 4, wherein the pre-function P(x) is obtained by:
   for at least one piece of the pre-function P(x), analysing a curvature of the second main function f(x) in at least one interval that corresponds to the piece of the pre-function P(x);

modifying a shape of the pre-function P(x) for the at least one piece according to the shape of the second main function f(x);

for the interval of values x that correspond to the at least one piece, calculating a LUT application error; and iterating until the LUT application error is less than a given value.

6. A device comprising:

memory configured to store processor-executable program code instructions; and at least one hardware processor configured to execute the program code instructions to:

apply a pre-function w=P(x) to an input signal x to obtain a first result w; and apply a look up table (LUT) to the first result w, wherein the LUT represents a main function $f_w(w)$ defined for a second grid of values Gw such that the pre-function P(x) is piecewise defined on a first grid Gx of signal values, where Gw=P(Gx), and wherein the pre-function P(x) is obtained from a second pre-function Q(x) by applying Q(x) to signal values x to calculate the second grid Gw=Q(Gx) and defining the pre-function P(x) piecewise on the first grid Gx by linear interpolation of the values of the second grid Gw such that P(Gx)=Q(Gx).

7. The device of claim 6, wherein the signal x is n-dimensional and the pre-function P(x) is applied to less than all the n dimensions of the signal x.

8. The device of claim 6, wherein the at least one hardware processor is further configured to execute the program code instructions to:

obtain the pre-function P(x), piecewise defined on the first grid Gx of the signal x; and calculate the LUT with the second grid Gw=P(Gx).

9. The device of claim 6, wherein the LUT is calculated by:

concatenating an inverse function $P^{-1}(w)$ of the pre-function P(x) and a second main function f(x) to obtain the main function $f_w(w)$ as concatenated function $f_w(w)=f(P^{-1}(w))$; and sampling the concatenated function over the second grid Gw.

10. The device of claim 9, wherein the pre-function P(x) is obtained by:

for at least one piece of the pre-function P(x), analysing a curvature of the second main function f(x) in at least one interval that corresponds to the piece of the pre-function P(x);

modifying a shape of the pre-function P(x) for the at least one piece according to the shape of the second main function f(x);

for the interval of values x that correspond to the at least one piece, calculating a LUT application error; and iterating until the LUT application error is less than a given value.

11. A non-transitory computer readable medium storing program code instructions that, when executed by a processor, implement a method comprising:

applying a pre-function w=P(x) to an input signal x to obtain a first result w; and applying a look up table (LUT) to the first result w, wherein the LUT represents a main function $f_w(w)$ defined for a second grid of values Gw such that the pre-function P(x) is piecewise defined on a first grid Gx of signal values, where Gw=P(Gx), and wherein the pre-function P(x) is obtained from a second pre-function Q(x) by applying Q(x) to signal values x to calculate the second grid Gw=Q(Gx) and defining the pre-function P(x) piecewise on the first grid Gx by linear interpolation of the values of the second grid Gw such that P(Gx)=Q(Gx).

12. The non-transitory computer readable medium of claim 11, wherein the signal x is n-dimensional and the pre-function P(x) is applied to less than all the n dimensions of the signal x.

13. The non-transitory computer readable medium of claim 11, wherein the program code instructions that, when executed by a processor, implement a method that further comprises:

obtaining the pre-function P(x), piecewise defined on the first grid Gx of the signal x; and calculating the LUT with the second grid Gw=P(Gx).

14. The non-transitory computer readable medium of claim 11, wherein the program code instructions that, when executed by a processor, implement a method that further comprises calculating the LUT by:

concatenating an inverse function $P^{-1}(w)$ of the pre-function P(x) and a second main function f(x) to obtain the main function $f_w(w)$ as concatenated function $f_w(w)=f(P^{-1}(w))$; and sampling the concatenated function over the second grid Gw.

15. The non-transitory computer readable medium of claim 14, wherein the program code instructions that, when executed by a processor, implement a method that further comprises obtaining the pre-function P(x) by:

for at least one piece of the pre-function P(x), analysing a curvature of the second main function f(x) in at least one interval that corresponds to the piece of the pre-function P(x);

modifying a shape of the pre-function P(x) for the at least one piece according to the shape of the second main function f(x);

for the interval of values x that correspond to the at least one piece, calculating a LUT application error; and iterating until the LUT application error is less than a given value.

\* \* \* \* \*